(12) United States Patent
Chen et al.

(10) Patent No.: US 12,308,321 B2
(45) Date of Patent: May 20, 2025

(54) STRUCTURES TO INCREASE SUBSTRATE ROUTING DENSITY AND METHODS OF FORMING THE SAME

(71) Applicant: Taiwan Semiconductor Manufacturing Company Limited, Hsinchu (TW)

(72) Inventors: Hsien-Wei Chen, Hsinchu (TW); Meng-Liang Lin, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 483 days.

(21) Appl. No.: 17/692,252

(22) Filed: Mar. 11, 2022

(65) Prior Publication Data

US 2023/0038892 A1    Feb. 9, 2023

Related U.S. Application Data

(60) Provisional application No. 63/229,873, filed on Aug. 5, 2021.

(51) Int. Cl.
| | |
|---|---|
| *H01L 23/538* | (2006.01) |
| *H01L 21/48* | (2006.01) |
| *H01L 23/00* | (2006.01) |
| *H01L 23/498* | (2006.01) |
| *H01L 25/00* | (2006.01) |
| *H01L 25/065* | (2023.01) |

(52) U.S. Cl.
CPC ........ *H01L 23/5384* (2013.01); *H01L 21/486* (2013.01); *H01L 23/49816* (2013.01); *H01L 23/5381* (2013.01); *H01L 23/5385* (2013.01); *H01L 24/14* (2013.01); *H01L 24/16* (2013.01); *H01L 25/0655* (2013.01); *H01L 25/50* (2013.01); *H01L 2224/14177* (2013.01); *H01L 2224/16235* (2013.01)

(58) Field of Classification Search
CPC ............... H01L 23/5384; H01L 21/486; H01L 23/49816
See application file for complete search history.

(56) References Cited

U.S. PATENT DOCUMENTS

2019/0304912 A1* 10/2019 Ecton .................. H01L 23/5386

* cited by examiner

*Primary Examiner* — Errol V Fernandes
(74) *Attorney, Agent, or Firm* — The Marbury Law Group, PLLC

(57) ABSTRACT

A semiconductor device structure includes a package substrate having a first side and a second side, a first stacking via formed within the package substrate, a second stacking via formed within the package substrate, and a first semiconductor die attached to the first side of the package substrate and electrically coupled to the first stacking via. The semiconductor device structure includes a second semiconductor die attached to the first side of the package substrate and electrically coupled to the second stacking via; and a bridge die attached to the second side of the package substrate and electrically coupled to the first stacking via and the second stacking via through first stacking via, the bridge die, and the second stacking via.

20 Claims, 11 Drawing Sheets

STRUCTURES TO INCREASE SUBSTRATE ROUTING DENSITY AND METHODS OF FORMING THE SAME

RELATED APPLICATIONS

This application claims priority to U.S. Provisional Patent Application No. 63/229,837 entitled "A Structure to Increase Substrate Routing Density" filed on Aug. 5, 2021, the entire contents of which are hereby incorporated by reference for all purposes.

BACKGROUND

The semiconductor industry has grown due to continuous improvements in integration density of various electronic components (e.g., transistors, diodes, resistors, capacitors, etc.). For the most part, these improvements in integration density have come from successive reductions in minimum feature size, which allows more components to be integrated into a given area.

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
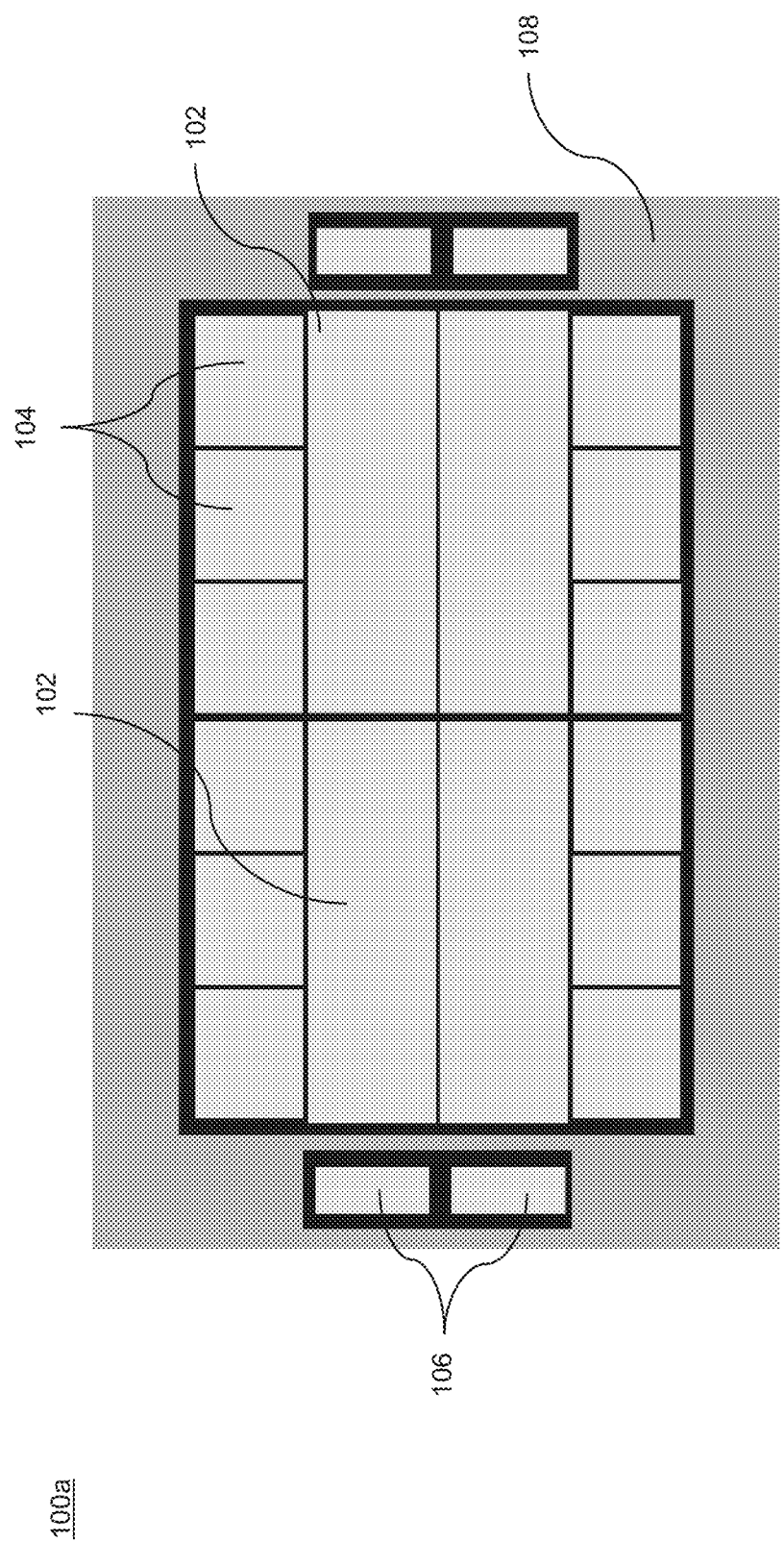
FIG. 1A is top view of a semiconductor device, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

According to various embodiments, a semiconductor device structure may include a first semiconductor die and a second semiconductor die that may be both attached and electrically coupled to a package substrate. The package substrate may include a redistribution interconnect structure that is configured to propagate signals between the first semiconductor die and the second semiconductor die. The package structure may further include a bridge die on the package substrate opposite to the first and second semiconductor dies. The bridge die may be mounted beside solder bumps, and has a higher density of interconnect structures than a density of the redistribution interconnect structure of the package substrate. For example, the bridge die may be formed by semiconductor processes on silicon substrate. The higher density interconnect structures may electrically couple the first semiconductor die to the second semiconductor die.

The presence of the bridge die may provide high-density interconnect structures (e.g., to electrically connect adjacent semiconductor dies to one another). For example, the bridge die may be embedded in the package substrate. In some embodiments, the placement of the bridge die within the body of the package substrate may lead to warpage and/or other mechanical distortions of the package substrate. Various embodiments disclosed herein may simplify the construction of the package substrate by allowing the bridge die to be coupled externally to the package substrate.

According to various embodiments, a semiconductor device structure includes a package substrate having a first side and a second side, a first stacking via formed within the package substrate, a second stacking via formed within the package substrate, and a first semiconductor die attached to the first side of the package substrate and electrically coupled to the first stacking via. The semiconductor device structure may further include a second semiconductor die attached to the first side of the package substrate and electrically coupled to the second stacking via, and a bridge die attached to the second side of the package substrate and electrically coupled to the first stacking via and the second stacking via, such that the first semiconductor die and the second semiconductor die may be electrically coupled to one another and signals propagate between the first semiconductor die and the second semiconductor die through first stacking via, the bridge die, and the second stacking via.

FIG. 1A is top view of a semiconductor device 100a, according to various embodiments. The semiconductor device 100a may include one or more integrated circuit (IC) semiconductor devices. For example, the semiconductor device 100a may include a first plurality of semiconductor dies 102 and a second plurality of semiconductor dies 104. In various embodiments, each of first plurality of semiconductor dies 102 may be configured as a three-dimensional device, such as a three-dimensional integrated circuit (3DICs), a system-on-chip (SOC) device, or a system-on-integrated-circuit (SoIC) device. The semiconductor device 100a may further include one or more additional semiconductor dies 106. For example, the one or more additional semiconductor dies 106 may be an integrated passive device die 336 (IPD) or other component, as described in greater detail below with reference to FIG. 3.

Each of first plurality of semiconductor dies 102 may be formed by placing chips over chips on a semiconductor wafer level to form three-dimensional devices. These three-dimensional devices may provide improved integration density and other advantages, such as faster speeds and higher bandwidths, due to a decreased length of interconnects between the stacked chips. In some embodiments, each one of the first plurality of semiconductor dies 102 may also be referred to as a "first die stack." In some embodiments, each of the first plurality of semiconductor dies 102 may be dies or chips, such as logic dies, or power management dies.

In the semiconductor device 100a of FIG. 1A, the first plurality of semiconductor dies 102 may include four first die stacks, each of which may be configured as a SOC device. In various embodiments, each of first plurality of semiconductor dies 102 may be adjacent to one another and may be located in a central portion of the semiconductor device 100a. The second plurality of semiconductor dies 104 may be located on a periphery around the first plurality of semiconductor dies 102, as shown in FIG. 1A.

In this example embodiment, the second plurality of semiconductor dies 104 may include twelve semiconductor dies. In some embodiments, the second plurality of semiconductor dies 104 may be three-dimensional IC semiconductor devices, and may also be referred to as "second die stacks." In some embodiments, the second plurality of semiconductor dies 104 may each be a semiconductor memory device, such as a high bandwidth memory (HBM) device. Although first plurality of semiconductor dies 102 includes four (4) semiconductor dies and the second plurality of semiconductor dies 104 includes twelve (12) semiconductor dies, greater or fewer die stacks may be included in the semiconductor device 100a, 100b, 100c in other embodiments.

Figure 1B:
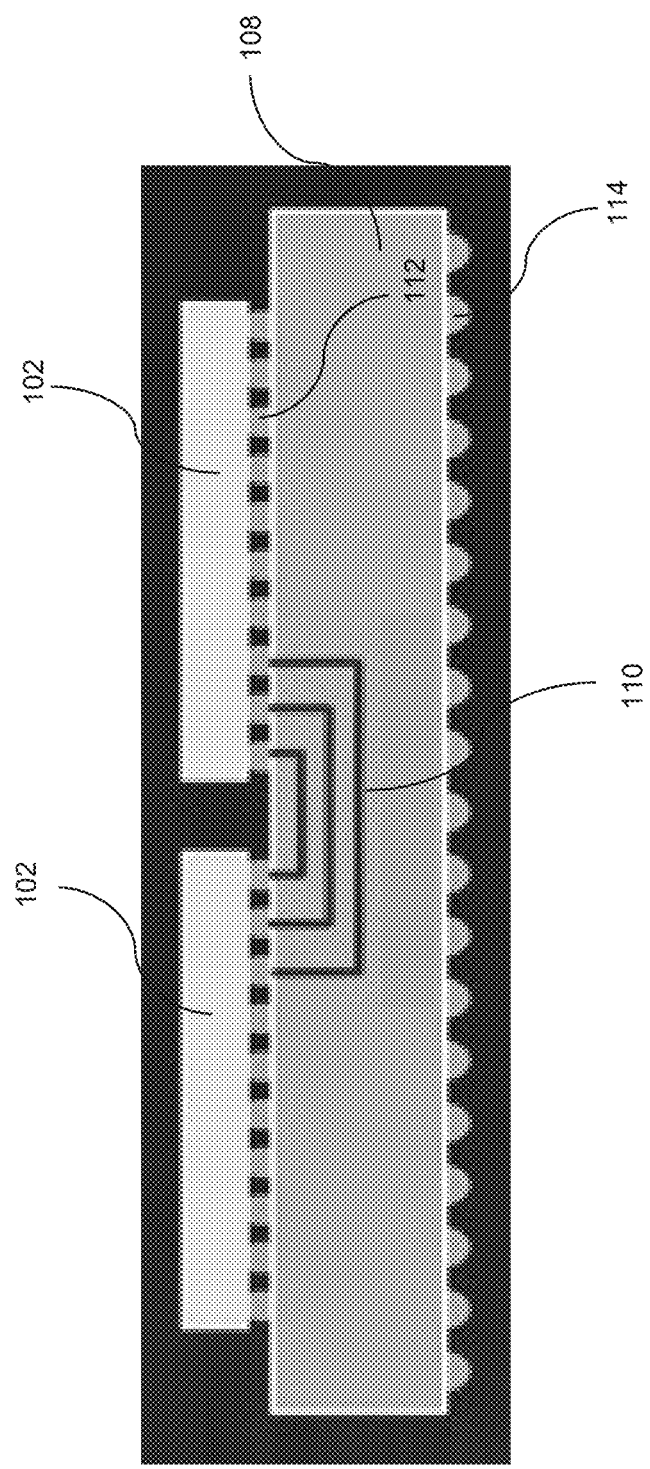
FIG. 1B is a vertical cross-sectional view of a semiconductor device.

FIG. 1B is a vertical cross-sectional view of a semiconductor device 100b. As shown, the semiconductor device 100b may include the first plurality of semiconductor dies 102 mounted to a package substrate 108. The package substrate 108 may include a suitable material, such as a semiconductor material (e.g., a semiconductor wafer, such as a silicon wafer), a ceramic material, an organic material (e.g., a polymer and/or thermoplastic material), a glass material, combinations thereof, etc. Other suitable substrate materials are within the contemplated scope of this disclosure. In various embodiments, the package substrate 108 may include a redistribution interconnect structure 110.

The first plurality of semiconductor dies 102 may be electrically coupled to the package substrate 108 via a first plurality of solder portions 112 that connect respective bonding pads or micro-bumps (not shown) of the respective first plurality of semiconductor dies 102 and the package substrate 108. The redistribution interconnect structure 110 may be configured to electrically couple each of the first plurality of semiconductor dies 102 to one another and to allow signal propagation therebetween. The package substrate 108 may further be electrically coupled to a printed circuit board (PCB) (not shown) via a second plurality of solder portions 114 that connect respective bump structures of the package substrate 108 and PCB.

Figure 1C:
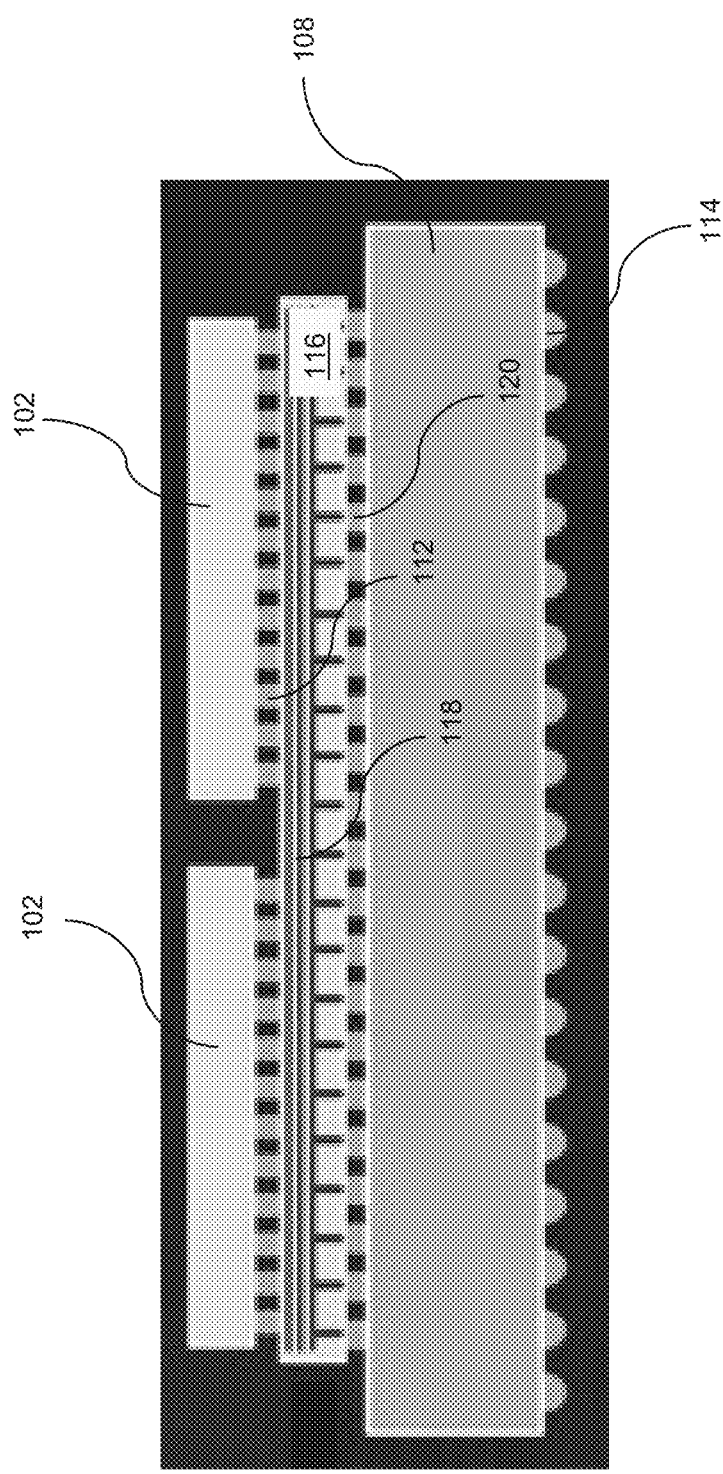
FIG. 1C is a vertical cross-sectional view of a further semiconductor device.

FIG. 1C is a vertical cross-sectional view of a further semiconductor device 100c. The semiconductor device 100c may include an interposer 116 having a redistribution interconnect structure 118. The first plurality of semiconductor dies 102 may be electrically coupled to the interposer 116 via a plurality of solder portions 112 that connect respective bonding pads or micro-bumps (not shown) of each of the first plurality of semiconductor dies 102 and the interposer 116. The semiconductor device 100c, including the first plurality of semiconductor dies 102 and the interposer 116, may further be coupled to a package substrate 108 via solder portions 120 that may couple respective bonding pads or bump structure of the interposer 116 and the package substrate 108.

The package substrate 108 may further be electrically coupled to a printed circuit board (PCB) (not shown) via solder portions 114 that connect respective bump structures of the package substrate 108 and PCB. The semiconductor device 100c may be similar to various other structures described in greater detail below. For example, the interposer 116 may be an organic interposer, as described below with reference to FIG. 2. Alternatively, the interposer 116 may be a silicon interposer 310, as described below with reference to FIG. 3.

Figure 2:
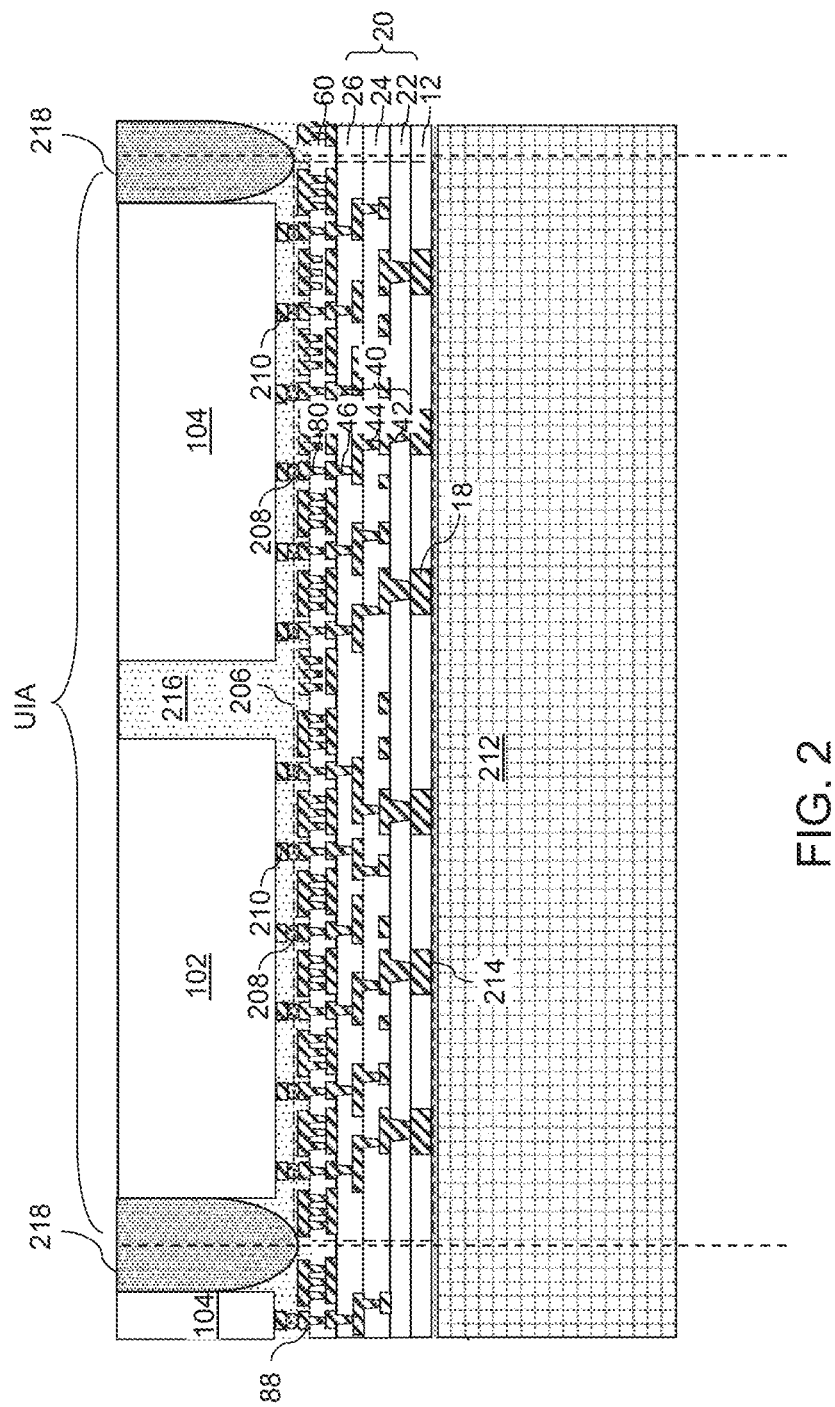
FIG. 2 is a vertical cross-sectional view of a fan-out wafer-level package structure including an organic interposer, according to various embodiments.

FIG. 2 is a vertical cross-sectional view of a fan-out wafer-level package 200 (FOWLP) according to various embodiments. In this example, at least one semiconductor die (102, 104) may be attached to the organic interposer 206. Each semiconductor die (102, 104) may be bonded to a respective subset of the die-side bonding structures 88 within a respective unit interposer area (UIA) through solder material portions 208. Each semiconductor die (102, 104) may include die bump structures 210. In one embodiment, the die bump structures 210 may include a two-dimensional array of micro-bump structures, and each semiconductor die (102, 104) may be attached to the die-side bonding structure 88 by C2 bonding (i.e., solder bonding between a pair of micro-bumps). A C2 bonding process that reflows the solder material portions 208 may be performed after the die bump structures 210 of the semiconductor dies (102, 104) are disposed over the array of solder material portions 208.

The carrier substrate 212 may be a circular wafer or a rectangular wafer. The lateral dimensions (such as the diameter of a circular wafer or a side of a rectangular wafer) of the carrier substrate 212 may be in a range from approximately 100 mm to approximately 500 mm, such as from 200 mm to 400 mm. Further embodiments may include carrier substrates having larger or smaller lateral dimensions.

Package-side bonding structures 18 may be formed over an adhesive layer 214, and may be used to provide bonding to a package substrate, and thus, are herein referred to as package-side bonding structures 18. In one embodiment, the package-side bonding structures 18 may be arranged as a two-dimensional array, which may be a two-dimensional periodic array such as a rectangular periodic array. In one embodiment, the package-side bonding structures 18 may be formed as controlled collapse chip connection (C4) bump structures.

The package-side bonding structures 18 may include any metallic material that may be bonded to a solder material. For example, an underbump metallurgy (UBM) layer stack may be deposited over the adhesive layer 214. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from approximately 5 microns to approximately 60 microns, such as from 10 microns to 30 microns. Alternative embodiments may include a UBM layer stack having smaller or larger thicknesses.

A polymer matrix layer, which is herein referred to as a proximal polymer matrix layer 12, may be deposited over the package-side bonding structure 18. The proximal polymer matrix layer 12 may include a dielectric polymer material such as polyimide (PI), benzocyclobutene (BCB), or polybenzobisoxazole (PBO). Other suitable dielectric materials are within the contemplated scope of disclosure. The thickness of the proximal polymer matrix layer 12 may be in a range from approximately 4 microns to approximately 60 microns. Alternative embodiments may include proximal polymer matrix layer 12 having larger or smaller thicknesses.

Redistribution interconnect structures 40 and additional polymer matrix layers may be formed over the package-side bonding structures 18 and the proximal polymer matrix layer 12. The additional polymer matrix layers are herein referred to collectively as interconnect-level polymer matrix layers 20. The interconnect-level polymer matrix layers 20 may include a plurality of polymer matrix layers (22, 24, 26) such as a first polymer matrix layer 22, a second polymer matrix layer 24, and a third polymer matrix layer 26. While the present disclosure is described using an embodiment in which three polymer matrix layers (22, 24, 26) embed redistribution interconnect structures 40, embodiments are expressly contemplated herein in which the interconnect-level polymer matrix layers 20 include two, four, or five or more polymer matrix layers.

The redistribution interconnect structures 40 may include multiple levels of redistribution interconnect structures 40 that are formed through a respective one of the polymer matrix layers (22, 24, 26). The redistribution interconnect structures 40 may include metal via structures, metal line structures, and/or integrated line and via structures. Each integrated line and via structure includes a unitary structure containing a metal line structure and at least one metal via structure. A unitary structure refers to a single continuous structure in which each point within the structure may be connected by a continuous line (which may or may not be straight) that extends only within the structure.

In an example embodiment, the redistribution interconnect structures 40 may include first redistribution interconnect structures 42 that are formed through, and/or on a top surface of, the first polymer matrix layer 22; second redistribution interconnect structures 44 that are formed through, and/or on a top surface of, the second polymer matrix layer 24; and third redistribution interconnect structures 46 that are formed through, and/or on a top surface of, the third polymer matrix layer 26. While an embodiment of the present disclosure includes the redistribution interconnect structures 40 embedded within three polymer matrix layers (22, 24, 26), embodiments are expressly contemplated herein in which the redistribution interconnect structures 40 are embedded within one, two, or four or more polymer matrix layers.

Each of the interconnect-level polymer matrix layers 20 may include a dielectric polymer material such as polyimide (PI), benzocyclobutene (BCB), or polybenzobisoxazole (PBO). Other suitable materials are within the contemplated scope of disclosure. The thickness of each interconnect-level polymer matrix layer 20 may be in a range from approximately 4 microns to approximately 20 microns, although alternative embodiments may include smaller or larger thicknesses.

The redistribution interconnect structures 40 may include at least one metallic material such as Cu, Mo, Co, Ru, W, TiN, TaN, WN, or a combination or a stack thereof. Other suitable materials are within the contemplated scope of this disclosure. For example, each of the redistribution interconnect structures 40 may include a layer stack of a TiN layer and a Cu layer. In embodiments in which a redistribution interconnect structure 40 includes a metal line structure, a thickness of the metal line structure may be in a range from approximately 2 microns to approximately 20 microns, although alternative embodiments may include smaller or larger thicknesses.

The redistribution interconnect structures 40 located at a topmost metal interconnect level may include metallic pad structures. In one embodiment, the metallic pad structures may be formed as a two-dimensional array. In one embodiment, the metallic pad structures may be formed as a pad portion of a respective unitary structure including a metallic pad structure and a metallic via structure. For example, the metallic pad structures may be located on a top surface of the third polymer matrix layer 26, and the metallic via structures may vertically extend through the third polymer matrix layer 26.

The at least one semiconductor die (102, 104) may include various types of semiconductor die. In one embodiment, for example, the semiconductor die (102, 104) may include a system-on-chip (SoC) die such as an application processor die. In another embodiment, the semiconductor die (102, 104) may include a plurality of semiconductor dies (102, 104). In one embodiment, the plurality of semiconductor dies (102, 104) may include a first semiconductor die 102 and at least one second semiconductor die 104. In one embodiment, the first semiconductor die 102 may be a central processing unit die, and the at least one second semiconductor die 104 may include a graphic processing unit die. In another embodiment, the first semiconductor die 102 may include a system-on-chip (SoC) die, and the at least one second semiconductor die 104 may include at least one high bandwidth memory (HBM) die, each of which includes a vertical stack of static random access memory dies and provides high bandwidth as defined under JEDEC standards (i.e., standards defined by The JEDEC Solid State Technology Association).

The semiconductor dies (102, 104) may be attached to the organic interposer 206 and may be positioned within a same horizontal plane. The least one semiconductor die (102, 104) may be attached to the die-side bonding structures 88 through at least one array of solder material portions 208. At least one underfill material portion 216 may be formed around each bonded array of solder material portions 208. Each underfill material portion 216 may be formed by injecting an underfill material around the array of solder material portions 208 after the solder material portions 208 are reflowed. Various underfill material application methods may be used, which may include, for example, a capillary underfill method, a molded underfill method, or a printed underfill method. In one embodiment, a plurality of semiconductor dies (102, 104) may be attached to an organic interposer 206 within each unit interposer area UIA, and a single underfill material portion 216 may continuously extend underneath the plurality of semiconductor dies (102, 104).

The third redistribution interconnect structures 46 may be configured to provide mechanical support to underlying structures within each organic interposer 206 during application and curing of the underfill material. For example, the underfill application process may apply pressure to the distal polymer matrix layer 60. The third redistribution interconnect structures 46 may provide mechanical support to prevent, or reduce, distortion of the distal polymer matrix layer 60 during the underfill application process, and may act to maintain the structural integrity of the organic interposers.

An epoxy molding compound (EMC) may be applied to gaps formed between the organic interposers 206 and the semiconductor dies (102, 104). The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC may provide better handling, good flowability, fewer voids, better fill, and fewer flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 214. For example, the curing temperature of the EMC may be in a range from 125° C. to 150° C.

The EMC may be cured at a curing temperature to form an EMC matrix that laterally encloses each of the semiconductor dies (102, 104). The EMC matrix may include a plurality of epoxy molding compound (EMC) frames 218 that are laterally adjoined to one another. Each EMC die frame 218 is located within a respective unit interposer area UIA, and laterally surrounds and embeds a respective set of at least one semiconductor die (102, 104), which may be a plurality of semiconductor dies (102, 104). Excess portions of the EMC may be removed from above the horizontal plane including the top surfaces of the semiconductor dies (102, 104) by a planarization process, which may use chemical mechanical planarization.

The exemplary structure of FIG. 2 may then be diced as shown by the dashed lines in FIG. 2 to form a FOWLP, which includes at least one semiconductor die (102, 104) (which may be a plurality of semiconductor dies), an organic interposer 206, an underfill material portion 216, and an EMC die frame 218. The EMC die frame 218 and the organic interposer 206 may have vertically coincident sidewalls (i.e., sidewalls) located within a same vertical plane. In embodiments in which the FOWLP includes a plurality of semiconductor dies (102, 104), the underfill material portion 216 may contact sidewalls of the plurality of semiconductor dies (102, 104). The EMC die frame 218 continuously extends around, and laterally encircles, the at least one semiconductor die (102, 104) within the FOWLP.

The carrier substrate 212 may be detached from the assembly of the organic interposers 206, the semiconductor dies (102, 104), and the EMC die frames 218. The adhesive layer 214 may be deactivated, for example, by a thermal anneal at an elevated temperature. Embodiments may include an adhesive layer 214 that includes a thermally-deactivated adhesive material. In other embodiments in which the carrier substrate 212 may be transparent, an adhesive layer 214 may include an ultraviolet-deactivated adhesive material. The FOWLP may then be attached to a package substrate in further embodiments. In some embodiments, integrated passive devices may be connected to the bonding-level metallic structures 80 before the underfill material portion 216 and EMC die frame 218 are formed on the interposer, or integrated passive devices may be embedded in the organic interposer 206, as described in one of the following embodiments.

Figure 3:
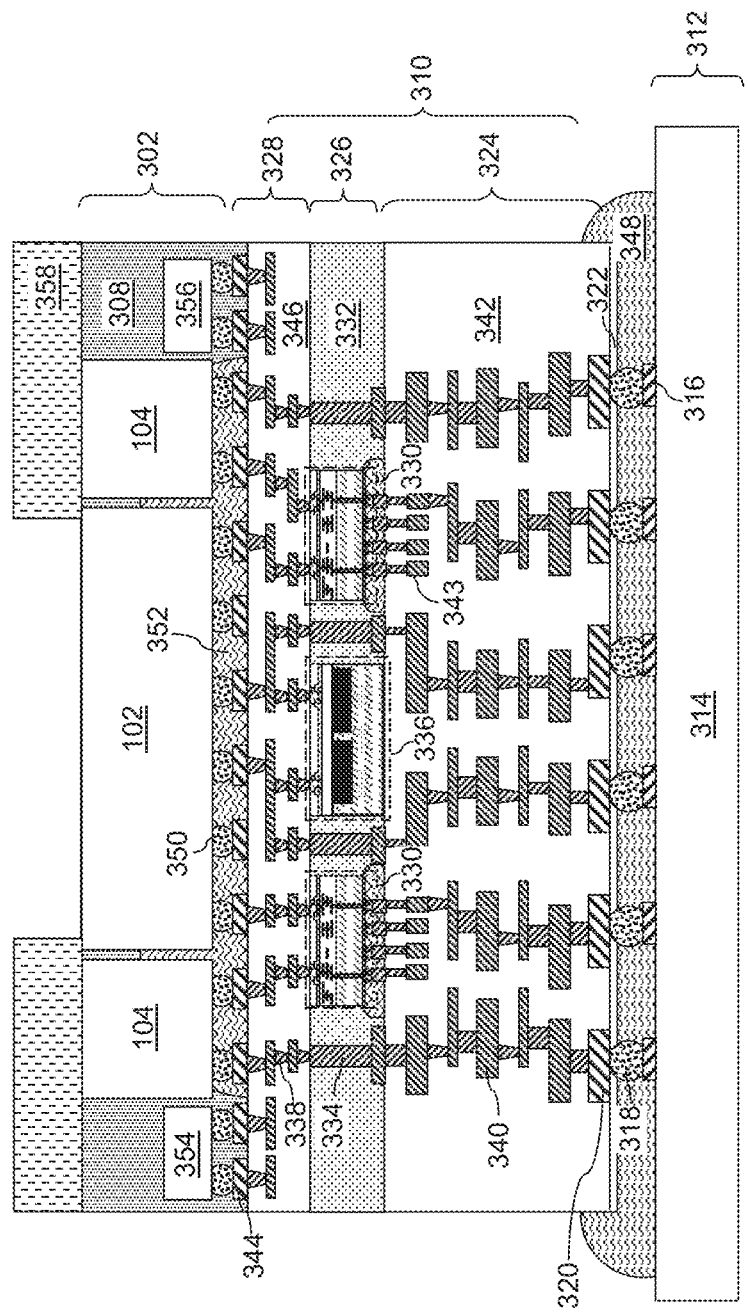
FIG. 3 is a vertical cross-sectional view of a fan-out wafer-level package structure including a silicon interposer, according to various embodiments.

FIG. 3 is a vertical cross sectional view of an exemplary structure 300 in which a FOWLP 302 including a plurality of semiconductor dies (102, 104) and an EMC multi-die frame 308 may be attached to a silicon interposer 310, according to various embodiments. The silicon interposer 310 may be bonded to a PCB 312 including a PCB substrate 314 and PCB bonding pads 316. An array of solder joints 318 may be formed to bond the package-side bonding pads 320 to the PCB bonding pads 316. The solder joints 318 may be formed by disposing an array of solder balls between the array of package-side bonding pads 320 and the array of PCB bonding pads 316, and by reflowing the array of solder balls. Optionally, a package-side dielectric cap layer 322 (such as a silicon oxide layer) may be deposited over the package-side bonding pads 320. The package-side dielectric cap layer 322 may be patterned to form an array of openings so that a surface of a respective one of the package-side bonding pads 320 may be physically exposed in each opening through the package-side dielectric cap layer 322.

The silicon interposer 310 includes a package-side redistribution structure 324, an interposer core assembly 326, and a die-side redistribution structure 328 located within a die area. The interposer core assembly 326 includes at least one bridge die 330 (described below with reference to FIG. 4), an epoxy molding compound (EMC) interposer frame 332 embedding the at least one bridge die 330, and optionally through-molding-compound via (TMCV) structures 334 that vertically extend through the EMC interposer frame 332.

In some embodiments, at least one integrated passive device 336 may be embedded in the EMC interposer frame 332. The at least one integrated passive device 336 may be electrically connected to die-side redistribution wiring interconnects 338 within the die-side redistribution structure 328, or to package-side redistribution wiring interconnects 340 within the package-side redistribution structure 324. The package-side redistribution wiring interconnects 340 may be formed within the package-side redistribution dielectric layers 342. The at least one bridge die 330 may be electrically connected to the package-side redistribution wiring interconnects 340 by a plurality of micro-bumps 343. In one embodiment, the electrical connections among the at least one bridge die 330, the optional integrated passive devices 336, and the die-side redistribution wiring interconnects 338 can be tested using die-side bonding pads 344.

The die-side redistribution structures 328 may be formed over the interposer core assembly 326. The die-side redistribution structures 328 are a subset of redistribution structures that are formed on the side of the structure to which semiconductor dies may be subsequently attached with respective to the interposer core assembly 326. For example, a die-side redistribution structure 328 may be formed within each die area over the two-dimensional array of interposer core assemblies 326 (of which only one is illustrated in FIG. 3). Each die-side redistribution structure 328 may include die-side redistribution dielectric layers 346, die-side redistribution wiring interconnects 338, and die-side bonding pads 344.

The die-side redistribution dielectric layers 346 may include a respective dielectric polymer material such as polyimide (PI), benzocyclobutene (BCB), or polybenzobisoxazole (PBO). Each die-side redistribution dielectric layer 346 may be formed by spin coating and drying of the respective dielectric polymer material. The thickness of each die-side redistribution dielectric layer 346 may be in a range from approximately 2 microns to approximately 40 microns, such as from 4 microns to 20 microns. Each die-side redistribution dielectric layer 346 may be patterned, for example, by applying and patterning a respective photoresist layer thereabove, and by transferring the pattern in the photoresist layer into the die-side redistribution dielectric layer 346 using an etch process such as an anisotropic etch process. The photoresist layer may be subsequently removed, for example, by ashing.

Each of the die-side redistribution wiring interconnects 338 and the die-side bonding pads 344 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 150 nm, and the copper seed layer may have a thickness in a range from 100 nm to 500 nm. The metallic fill material for the die-side redistribution wiring interconnects 338 may include copper, nickel, or copper and nickel.

The thickness of the metallic fill material that is deposited for each die-side redistribution wiring interconnect 338 may be in a range from approximately 2 microns to approximately 40 microns, such as from 4 microns to 20 microns, although smaller or larger thicknesses may also be used. The total number of levels of wiring in each die-side redistribution structure 328 (i.e., the levels of the die-side redistribution wiring interconnects 338) may be in a range from 1 to 12, such as from 2 to 8. The total height of the die-side redistribution structure 328 may be in a range from 30 microns to 300 microns, although smaller or larger heights may also be used.

In one embodiment, the thicknesses of the die-side redistribution dielectric layers 346 and the die-side redistribution wiring interconnects 338 may be selected such that die-side redistribution wiring interconnects 338 provided at different wiring levels have different thicknesses. Thick die-side redistribution wiring interconnects 338 may be used to provide low resistance conductive paths. Thin die-side redistribution wiring interconnects 338 may be used to provide shielding from electromagnetic interference (EMI).

The pattern of the die-side redistribution wiring interconnects 338 in the bottommost level of the die-side redistribution structure 328 may include via structures that contact metal bonding structures 410 of the bridge dies 330 (described below with reference to FIG. 4), metal bonding structures (not shown) of the integrated passive devices 336, and TMCV structures 334.

The die-side bonding pads 344 may be formed on the topmost one of the die-side redistribution dielectric layers 346. For example, a copper seed layer may be deposited on the die-side redistribution dielectric layers 346 by sputtering (i.e., physical vapor deposition). The thickness of the copper seed layer may be in a range from 50 nm to 500 nm. A photoresist layer (not shown) may be applied over the copper seed layer, and may be lithographically patterned to form openings within each dies in the pattern of an array of bonding pads. Copper may be electroplated within the openings in the photoresist layer. The thickness of the electroplated copper may be in a range from 5 microns to 50 microns, such as from 10 microns to 20 microns, although smaller and larger thicknesses may also be used.

The die-side bonding pads 344 may have horizontal cross-sectional shapes of rectangles, rounded rectangles, or circles. The photoresist layer may be removed by ashing, and horizontal portions of the copper seed layer between electroplated copper portions may be etched back, for example, using a wet etch process. Remaining discrete portions of copper include the die-side bonding pads 344, which are bonding pads that are subsequently used to attach solder material portions to be bonded to a respective semiconductor die.

A first subset of the die-side redistribution wiring interconnects 338 within the die-side redistribution structure 328 (e.g., see FIG. 3) may include segments of vertical signal paths that are connected to through-silicon via (TSV) structures 404 (e.g., see FIG. 4 and related description, below) that may be surrounded by a through-substrate insulating spacer 405. An insulating material may be conformally deposited into the array of openings and over the front-side surface of the silicon substrate 402 to form through-substrate insulating spacers 405. The insulating material of the through-substrate insulating spacer 405 may include silicon oxide (such as TEOS oxide) and/or silicon nitride. The thickness of the through-substrate insulating spacer 405 may be in a range from 1% to 30%, such as from 2% to 15%, of the maximum lateral dimension of each opening in the silicon substrate 402. For example, the through-substrate insulating spacer 405 may have a thickness in a range from 100 nm to 1,000 nm, although lesser and greater thicknesses may also be used.

A second subset of the die-side redistribution wiring interconnects 338 within the die-side redistribution structure 328 includes horizontally-extending portions of chip-to-chip signal paths that may be used to provide direct communication between at least two semiconductor dies to be subsequently attached to the interposer structure 310. The chip-to-chip signal paths may include a subset of the metal interconnect structures 408 (e.g., see FIG. 4 and related description, below) within at least one bridge die 330 to provide high areal wiring density in a plan view (i.e., in a view along a vertical direction). In such an embodiment, at least two semiconductor dies (e.g., see FIG. 3 and related description, below) may be electrically isolated from the package-side redistribution wiring interconnects 340 and from the TMCV structures 334 to reduce or eliminate cross-talk with vertically-propagating signals that pass through the TSV structures 404 (e.g., see FIG. 4) or the TMCV structures 334 (e.g., see FIG. 3). The TMCV structures 334 electrically connect a respective pair of a die-side redistribution wiring interconnect 338 within the die-side redistribution structure 328 and a package-side redistribution wiring interconnect 340 within the package-side redistribution structure 324.

An underfill material portion 348 may be formed around the solder joints 318 by applying and shaping an underfill material. The FOWLP 302 is attached to the silicon interposer 310 by connecting solder portion 350 to die-side bonding pads 344. The FOWLP 302 further includes at least one underfill material potion 352 that is embedded within the EMC multi-die frame 308 along with the plurality of semiconductor dies (102, 104).

In one embodiment, at least one passive device component (354, 356) may be optionally attached to the die-side redistribution structure 328 through additional solder material portions 350. The at least one passive device component (354, 356) may include any passive device such as a capacitor, an inductor, an antenna, etc. The at least one passive device component (354, 356) may be embedded within the EMC multi-die frame 308.

Optionally, a stabilization structure 358, such as a cap structure or a ring structure, may be attached to the assembly of the EMC matrix to reduce deformation of the assembly of the two-dimensional array of interposer structures 310, the EMC matrix, and the semiconductor dies (102, 104) embedded therein during subsequent processing steps. The stabilization structure 358 may counteract the tendency for the EMC die frame 308 to crack under stress around the periphery of the semiconductor dies (102, 104) in case the area of the EMC die frame 308 becomes relatively large. The stabilization structure 358, which may be embodied as a cap structure or a ring structure, may be attached to each EMC die frame 308 to reduce deformation of the assembly during subsequent processing steps and/or during usage of the assembly. for example, the stabilization structure 358 may be attached to the top surface of the EMC die frame 308, and may extend inwardly over the periphery of the assembly of the semiconductor dies (102, 104). In one embodiment, the stabilization structure 358 may include a metal ring structure.

Figure 4:
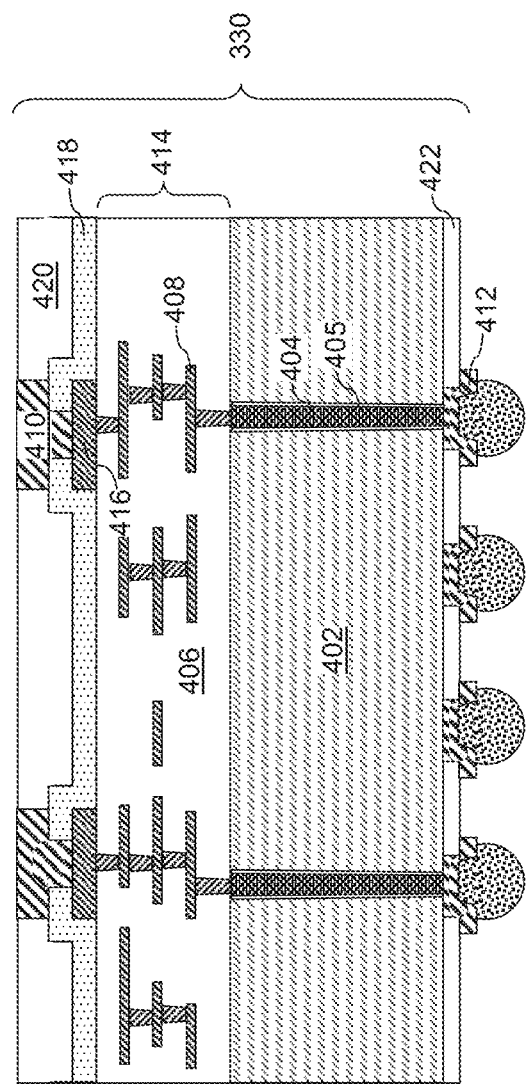
FIG. 4 is vertical cross sectional view of a bridge die, according to various embodiments.

FIG. 4 is vertical cross sectional view of a bridge die 330, according to various embodiments. The bridge die 330 includes a silicon substrate 402, a respective set of TSV structures 404 vertically extending through the respective silicon substrate 402, a set of interconnect-level dielectric layers 406 embedding a respective set of metal interconnect structures 408, a set of metal bonding structures 410 that are electrically connected to a subset of die-side redistribution wiring interconnects 338 (e.g., see FIG. 3); and a set of backside bonding pads 412 that are electrically connected to package-side redistribution wiring interconnects 340 (e.g., see FIG. 3) through a respective array of micro-bumps 343 (e.g., see FIG. 3). In one embodiment, at least one set of metal interconnect structures 408 within the at least one bridge die 330 is configured to provide electrically conductive paths that connect a respective pair of the die-side redistribution wiring interconnects 338 (e.g., see FIG. 3) and are electrically isolated from the package-side redistribution wiring interconnects 340 (e.g., see FIG. 3).

A total number of metal line levels in the interconnect-level structure 414 may be in a range from 2 to 12, such as from 3 to 6, although smaller and larger numbers of metal line levels may also be used. Metal pad structures 416 may be formed at the topmost level of the interconnect-level structure 414. A passivation dielectric layer 418 such as a silicon nitride layer may be deposited over the metal pad structures 416. The thickness of the passivation dielectric layer 418 may be in a range from approximately 30 nm to approximately 100 nm. Metal bonding structures 410 may be formed on each metal pad structure 416. The metal bonding structures 410 may be configured for C4 (controlled collapse chip connection) bonding, or may be configured for C2 bonding.

In embodiments in which the metal bonding structures 410 are configured for C4 bonding, the metal bonding structures 410 may include copper pads having a thickness in a range from approximately 5 microns to approximately 30 microns and having a pitch in a range from 40 microns to 100 microns. In embodiments in which the metal bonding structures 410 are configured for C2 bonding, the metal bonding structures 410 may include copper pillars having a diameter in a range from approximately 10 microns to approximately 30 microns and having a pitch in a range from 20 microns to 60 microns. In such an embodiment, the copper pillars may be subsequently capped with a solder material to provide C2 bonding.

Subsequently, a temporary carrier substrate (not shown) may be attached to the metal bonding structures 410 and the optional pad-level dielectric layer 420. A temporary adhesive layer (not shown) may be used to attach the temporary carrier substrate to the surfaces of the metal bonding structures 410 and the optional pad-level dielectric layer 420. The temporary carrier substrate may have the same size as the silicon wafer.

The backside of the silicon wafer may be thinned until bottom surfaces of the TSV structures 404 are physically exposed. The thinning of the silicon wafer may be effected, for example, by grinding, polishing, an isotropic etch process, an anisotropic etch process, or a combination thereof. For example, a combination of a grinding process, an isotropic etch process, and a polishing process may be used to thin the backside of the silicon wafer. The thickness of the silicon wafer after thinning may be in a range from 20 microns to 150 microns, such as from 50 microns to 100 microns. The thickness of the silicon wafer after thinning is thin enough to physically expose backside surfaces (i.e., bottom surfaces) of the TSV structures 404, and is thick enough to provide sufficient mechanical strength to each silicon substrate 402 upon dicing the semiconductor wafer.

At least one dielectric material such as silicon nitride and/or silicon oxide may be deposited over the backside surface of the silicon wafer and over the physically exposed end surfaces of the TSV structures 404 to form a backside insulating layer 422. The thickness of the backside insulating layer 422 may be in a range from 100 nm to 1,000 nm, such as from 200 nm to 500 nm, although lesser and greater thicknesses may also be used. Openings are formed through the backside insulating layer 422, for example, by applying and lithographically patterning a photoresist layer, and transferring the pattern of the openings in the photoresist layer through the backside insulating layer 422 using an anisotropic etch process. A bottom surface of each TSV structure 404 may be physically exposed. The photoresist layer may be subsequently removed, for example, by ashing. At least one conductive material may be deposited on the physically exposed bottom surfaces of the TSV structures 404, and may be patterned to form backside bonding pads 412.

Figure 5:
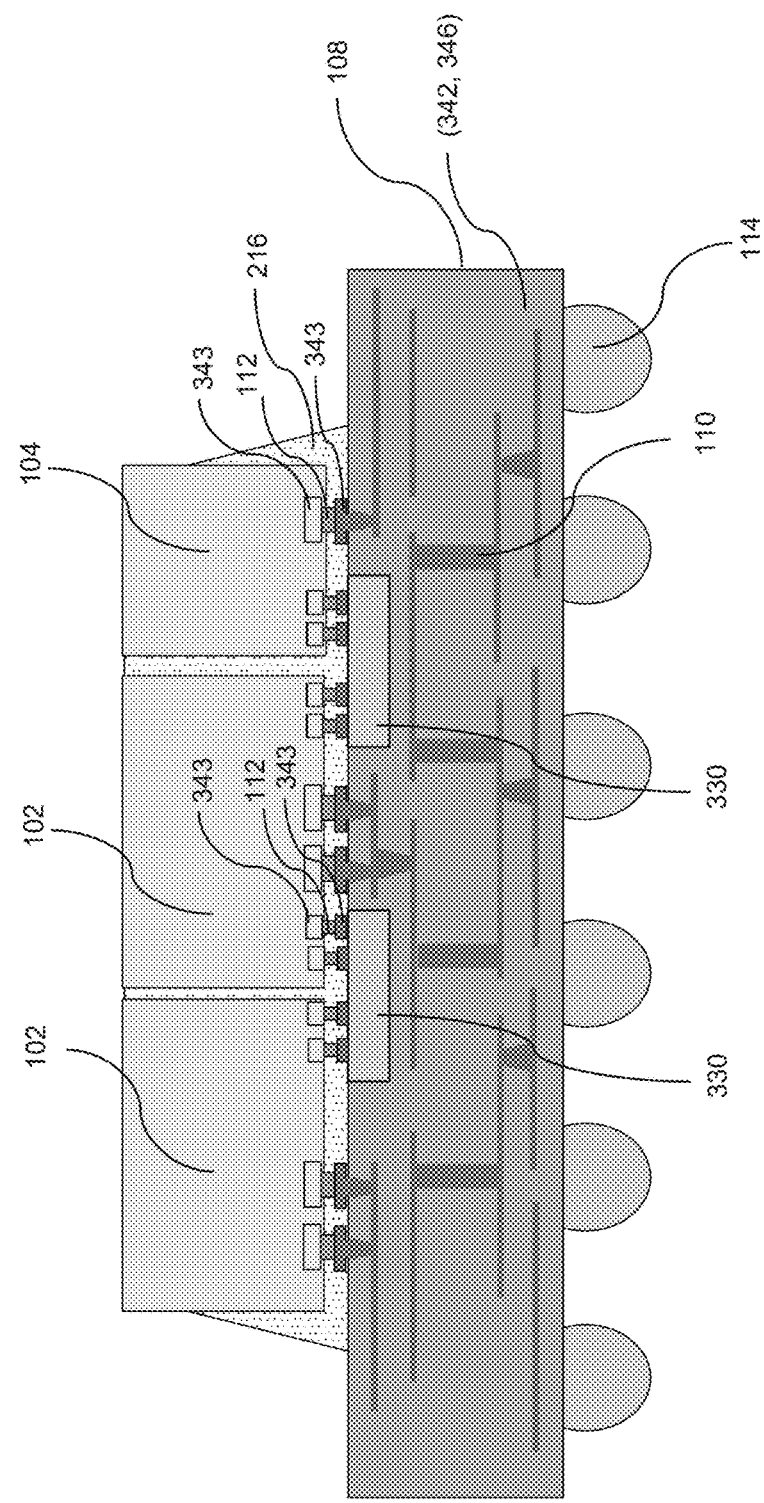
FIG. 5 is a vertical cross-sectional view of a semiconductor device.

FIG. 5 is a vertical cross-sectional view of a semiconductor device 500, according to various embodiments. As shown, the semiconductor device 500 may include semiconductor dies (102, 104) mounted to a package substrate 108. The package substrate 108 may include a dielectric layer (342, 346) surrounding a redistribution interconnect structure 110. The package substrate 108 may further include one or more bridge dies 330, as described above with reference to FIGS. 3 and 4. As shown, the one or more bridge dies 330 may be embedded in the package substrate 108 and may include metal interconnect structures 408 (e.g., see FIG. 4 and related description above).

The semiconductor dies (102, 104) may be electrically coupled to the package substrate 108 via a first plurality of solder portions 112 that connect respective bonding pads or micro-bumps 343 of the respective semiconductor dies (102, 104) and the package substrate 108. As shown, the semiconductor dies (102, 104) may also be electrically coupled to the bridge dies 330 with respective bonding pads or micro-bumps 343 of the respective semiconductor dies (102, 104) and the bridge dies 330. The redistribution interconnect structure 110 and the bridge dies 330 may be configured to electrically couple the semiconductor dies (102, 104) to one another and to allow signal propagation therebetween. The package substrate 108 may further be electrically coupled to a PCB (not shown) via a second plurality of solder portions 114 that connect respective bump structures of the package substrate 108 and PCB.

At least one underfill material portion 216 may be formed around each bonded array of solder portions 112. Each underfill material portion 216 may be formed by injecting an underfill material around the array of solder portions 112 after the solder portions 112 are reflowed. In one embodiment, the semiconductor dies (102, 104) may be attached to the package substrate 108 and a single underfill material portion 216 may continuously extend underneath the semiconductor dies (102, 104).

The metal interconnect structures 408 of the one or more bridge dies 330 may have a higher density of interconnect structures than a density of the redistribution interconnect structure 110 of the package substrate 108. The presence of the one or more bridge dies 330 may simplify the redistribution interconnect structure 110 of the package substrate 108 by providing high-density interconnect structures only where needed (e.g., to electrically connect adjacent semiconductor dies to one another). In some embodiments, however, the placement of the one or bridge dies 330 within the body of the package substrate 108 may lead to warpage and/or other mechanical distortions of the package substrate 108. Further embodiments may simplify the construction of the package substrate 108 by configuring the bridge die 330 to be coupled externally to the package substrate 108, as described in greater detail with reference to FIGS. 6 to 8, below.

Figure 6:
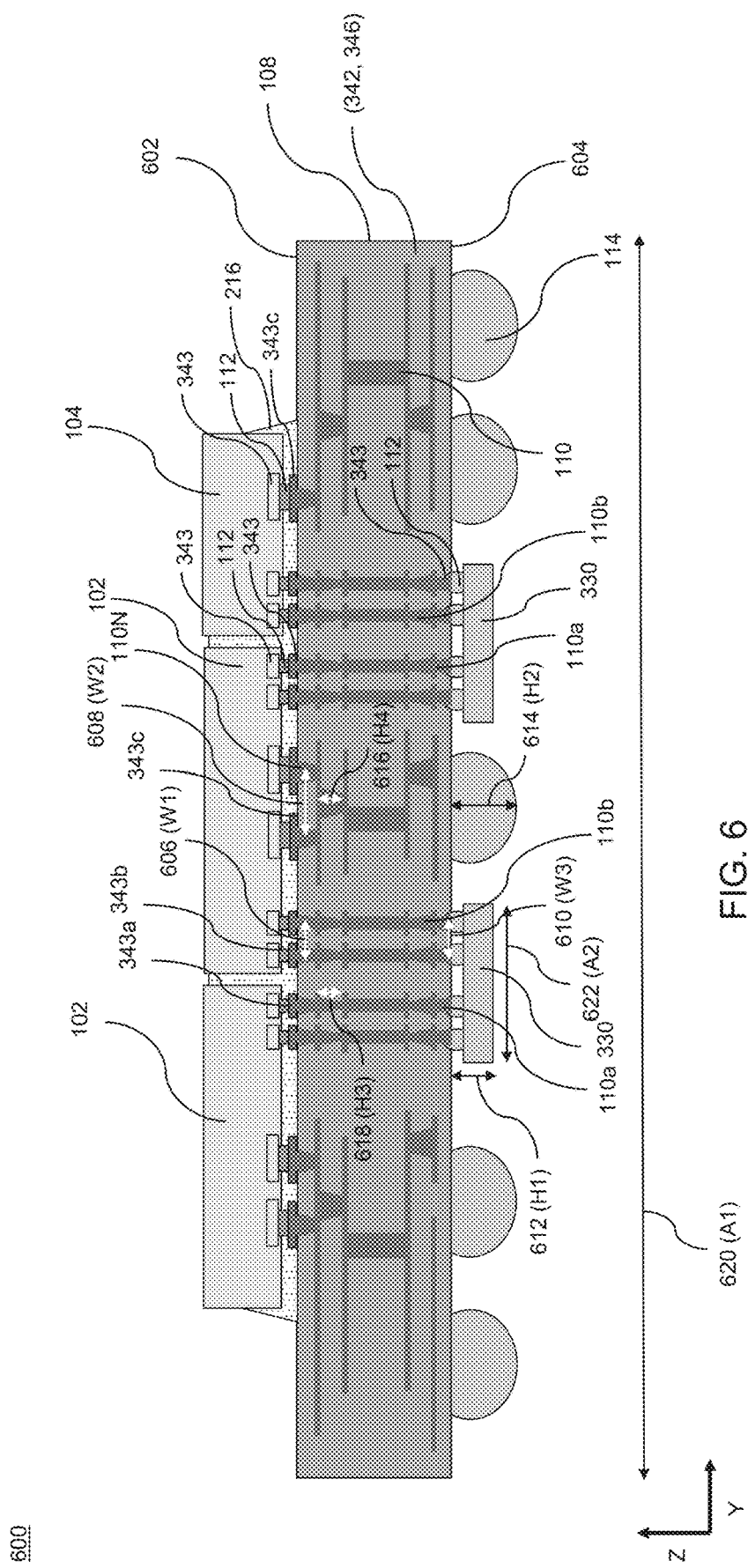
FIG. 6 is a vertical cross-sectional view of a further semiconductor device, according to various embodiments.

FIG. 6 is a vertical cross-sectional view of a semiconductor device 600, according to various embodiments. As shown, the semiconductor device 600 may include semiconductor dies (102, 104) mounted to a package substrate 108. The package substrate 108 may include a dielectric layer (342, 346) having a first side 602 and a second side 604 and may include a first stacking via 110a formed within the package substrate 108 and a second stacking via 110b formed within the package substrate 108. The first stacking via 110a and the second stacking via 110b may each include a plurality of vertically aligned vias, as shown. The package substrate 108 may further include a redistribution interconnect structure 110 that includes non-stacking vias 110N in addition to the first stacking via 110a and the second stacking via 110b. A first semiconductor die 102 may be attached to the first side 602 of the package substrate 108 and may be electrically coupled to the first stacking via 110a. A second semiconductor die 104 may be attached to the first side 602 of the package substrate 108 and may be electrically coupled to the second stacking via 110b.

The semiconductor device 600 may further include a bridge die 330 attached to an external surface of the package substrate 108. In this regard, the bridge die 330 may be attached to the second side 604 of the package substrate and may be electrically coupled to the first stacking via 110a and the second stacking via 110b. As such, the first semiconductor die 102 and the second semiconductor die 104 may be electrically coupled to one another such that signals may be propagated from the first semiconductor die 102 to the second semiconductor die 104 and from the second semiconductor die 104 to the first semiconductor die 102 through electrical pathways formed by the first stacking via 110a, the bridge die 330, and the second stacking via 110b. In various embodiments, the bridge die 330 may be configured to provide active and/or or passive interconnects between the first semiconductor die 102 and the second semiconductor die 102.

The placement of the bridge die 330 on the second side 604 of the package substrate 108 may provide an increased routing density of the active and/or or passive interconnects between the first semiconductor die 102 and the second semiconductor die 102. For example, the bridge die may be formed using semiconductor processes on a silicon substrate. As such, the bridge die 330 may have connections having a finer pitch width W1 (e.g., 10 to 100 microns) than connections formed in the package substrate 108. For example, connections formed in the package substrate 108 may have a pitch width W2 such that a ratio a ratio W1/W2 varies from 0 to 1, as described in greater detail below. The first stacking via 110a and the second stacking via 110b may thereby serve to provide connections between the semiconductor dies (102, 104) and the bridge die 330 that are sufficiently finer than connections (e.g., non-stacking vias 110N) otherwise formed in the package substrate 108. Thus, the increased routing density may be provided by the finer connections formed in the semiconductor dies (102, 104), the bridge die 330, and the first stacking via 110a and the second stacking via 110b.

The semiconductor dies (102, 104) may be electrically coupled to the package substrate 108 with a first plurality of solder portions 112 that connect respective bonding pads or micro-bumps 343 of the respective semiconductor dies (102, 104) and the package substrate 108. The bridge die 330 may be electrically coupled to the package substrate 108 with a first plurality of solder portions 112 that connect respective bonding pads or micro-bumps 343 of the bridge die with bonding pads or micro-bumps 343 of the package substrate 108. The package substrate 108 may further be electrically coupled to a PCB (not shown) with a second plurality of solder portions 114 that connect respective bump structures of the package substrate 108 and PCB.

At least one underfill material portion 216 may be formed around each bonded array of solder portions 112 on the first side 602 of the package substrate 108. Each underfill material portion 216 may be formed by injecting an underfill material around the array of solder portions 112 after the solder portions 112 are reflowed. In one embodiment, the semiconductor dies (102, 104) may be attached to the package substrate 108 and a single underfill material portion 216 may continuously extend underneath the semiconductor dies (102, 104).

Placement of the bridge die 330 on an external surface (e.g., on the second side 604 of the package substrate 108) may simplify construction of the package substrate 108 and may avoid warpage and other mechanical distortions that may otherwise occur in embodiments in which the bridge die 330 is embedded in the package substrate 108 (e.g., see FIG. 5 and related description above).

As shown in FIG. 6, the first stacking via 110a and the second stacking via 110b respectively may include first electrical connections 343a and second electrical connections 343b on the first side 602 of the package substrate 108 that are respectively connected to the first semiconductor die 102 and the second semiconductor die 104. The first electrical connections 343a and the second electrical connections 343b may each include a first pitch width W1 606 that is in a first range from approximately 10 microns to approximately 100 microns. The non-stacking vias 110N may further include third electrical connections 343c that are electrically connected to the first semiconductor die 102 and/or to the second semiconductor die 104, and wherein the third electrical connections 343c that include a second pitch width W2 608 such that a ratio W1/W2 of the first pitch width W1 to the second pitch width W2 is in a second range from approximately 0 to approximately 1.

The bridge die 330 may further include electrical bump connections including a third pitch width W3 610 such that a ratio W1/W3 of the first pitch width W1 to the third pitch width W3 is in a third range from approximately 0.9 to approximately 1. The bridge die 330 may further include a first height H1 612 that is in a fourth range from approximately 50 microns to approximately 200 microns.

As shown in FIG. 6, the second plurality of solder portions 114 may be formed as a ball grid array on the second side 604 of the package substrate 108. Further, the second plurality of solder portions 114 may include a second height H2 614, such that a ratio H1/H2 of the first height H1 to the second height H2 is in a fifth range from approximately 0.1 to approximately 1. The first stacking via 110a and the second stacking via 110b may each include portions having a third height H3 618 that is approximately equal to a fourth height H4 616 of a portion of the non-stacking via 110N. The first side 602 and the second side 604 of the package substrate 108 may each have a first area A1 620 and the bridge die 330 may have a second area A2 622. In one embodiment, a ratio A2/A1 of the second area A2 to the first area A1 may be in a sixth range from approximately 1% to 50%.

Figure 7:
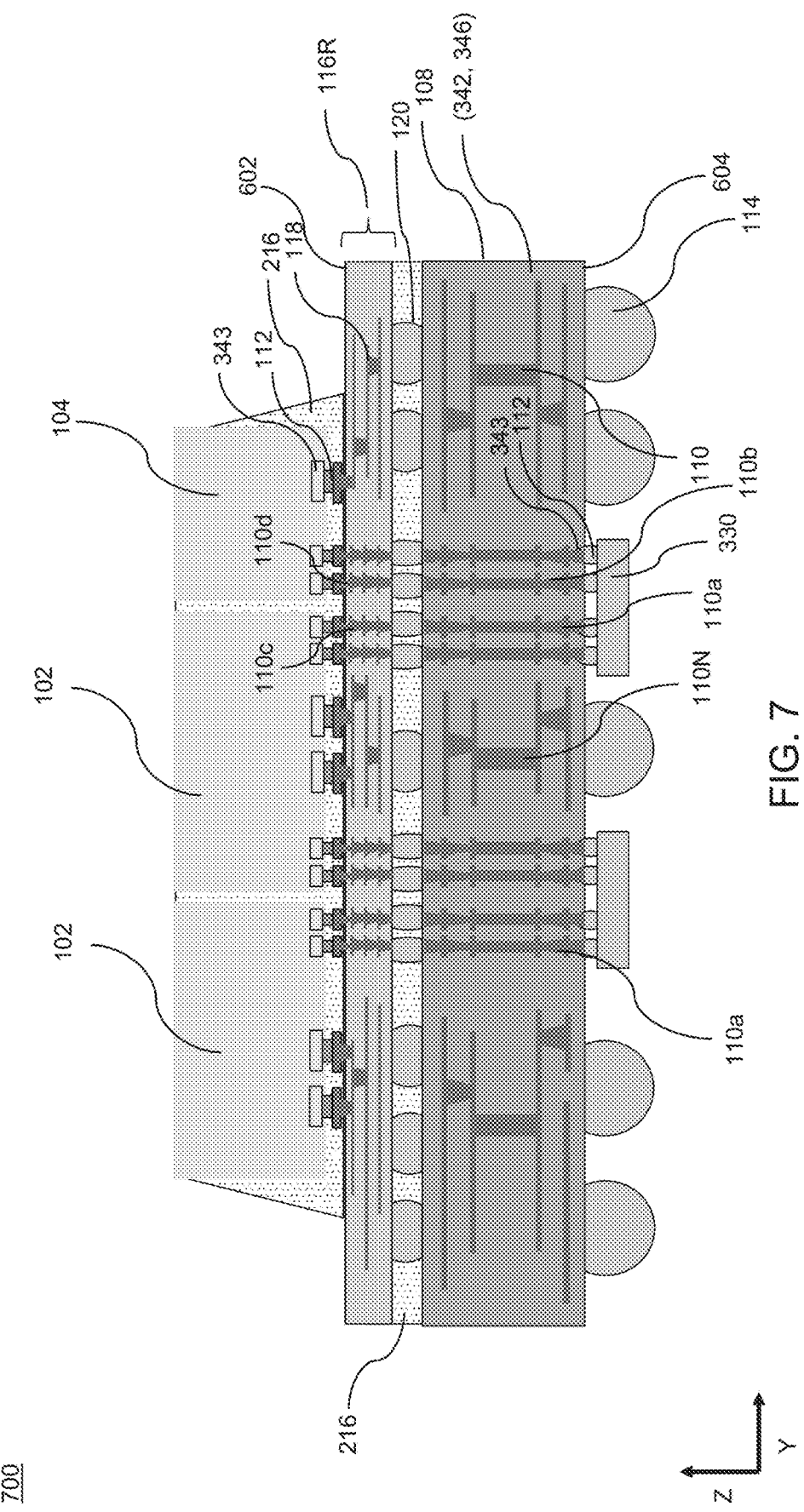
FIG. 7 is a vertical cross-sectional view of a further semiconductor device, according to various embodiments.

FIG. 7 is a vertical cross-sectional view of a further semiconductor device 700, according to various embodiments. The semiconductor device 700 may include an interposer 116R having a redistribution interconnect structure 118. In this example, the interposer 116R may be an organic interposer (e.g, see FIG. 2 and related description above).

The semiconductor device 700 may include semiconductor dies (102, 104) that may be electrically coupled to the interposer 116R via a plurality of solder portions 112 that connect respective bonding pads or micro-bumps 343 of each of the semiconductor dies (102, 104) and the interposer 116R. The semiconductor device 700 including the semiconductor dies (102, 104) and the interposer 116R, may further be coupled to a package substrate 108 via solder portions 120 that may couple respective bonding pads or bump structure of the interposer 116R and the package substrate 108.

The package substrate 108 may further be electrically coupled to a PCB (not shown) via solder portions 114 that connect respective bump structures of the package substrate 108 and PCB. The semiconductor device 700 may be similar to various other structures described in greater detail below. For example, the interposer 116R may be an organic interposer, as described above with reference to FIG. 2, while in further embodiments, the interposer may be a silicon interposer 116S (e.g., see FIG. 3 and related description), as described in greater detail below with reference to FIG. 8.

As described above with reference to FIG. 6, the package substrate 108 may include a dielectric layer (342, 346) having a first stacking via 110a formed within the package substrate 108 and a second stacking via 110b formed within the package substrate 108. The interposer 116R may similarly include a third stacking via 110c formed within the interposer 116R and a fourth stacking via 110d formed within the interposer 116R. The package substrate 108 may further include a redistribution interconnect structure 110 that includes non-stacking vias 110N in addition to the first stacking via 110a and the second stacking via 110b.

A first semiconductor die 102 may be attached to a first side 602 of the interposer 116R and may be electrically coupled to the third stacking via 110c of the interposer 116R. A second semiconductor die 104 may be attached to the first side 602 of the interposer 116R and may be electrically coupled to the fourth stacking via 110d of the interposer 116R. As shown, the third stacking via 110c of the interposer 116R may be electrically coupled to the first stacking via 110a of the package substrate 108 and the fourth stacking via 110d of the interposer 116R may be electrically coupled to the second stacking via 110b of the package substrate 108.

The semiconductor device 600 may further include a bridge die 330 attached to an external surface of the package substrate 108. In this regard, the bridge die 330 may be attached to the second side 604 of the package substrate and may be electrically coupled to the first stacking via 110a and the second stacking via 110b. The bridge die 330 may be electrically coupled to the package substrate 108 with a first plurality of solder portions 112 that connect respective bonding pads or micro-bumps 343 of the bridge die with bonding pads or micro-bumps 343 of the package substrate 108. In various embodiments, the bridge die 330 may be configured to provide active and/or or passive interconnects between the first semiconductor die 102 and the second semiconductor die 102. Further, the placement of the bridge die 330 on the second side 604 of the package substrate 108 may provide an increased routing density of the active and/or or passive interconnects between the first semiconductor die 102 and the second semiconductor die 102.

At least one underfill material portion 216 may be formed around each bonded array of solder portions 112 on the first side 602 of the package substrate 108. Each underfill material portion 216 may be formed by injecting an underfill material around the array of solder portions 112 after the solder portions 112 are reflowed. In one embodiment, the semiconductor dies (102, 104) may be attached to the package substrate 108 and a single underfill material portion 216 may continuously extend underneath the semiconductor dies (102, 104). A similar underfill material portion 216 may be formed around each bonded array of solder portions 120 between the interposer 116R and the package substrate 108.

As shown in FIG. 7, the semiconductor device 700 includes an interposer 116R separating the first semiconductor die 102 and the second semiconductor die 104 from the package substrate 108, such that the first semiconductor die 102 and the second semiconductor die 104 are attached to the interposer 116R. The first semiconductor die 102 is electrically connected to the first stacking via 110a of the package substrate 108 through first electrical connections (e.g., the third stacking via 110c) within the interposer 116R. The second semiconductor die 104 is electrically connected to the second stacking via 110b of the package substrate 108 through second electrical connections (e.g., the fourth stacking via 110d) within the interposer 116R.

As such, the first semiconductor die 102 and the second semiconductor die 104 are electrically coupled to one another such that signals may be propagated from the first semiconductor die 102 to the second semiconductor die 104 and from the second semiconductor die 104 to the first semiconductor die 102 through electrical pathways formed by the first electrical connections (e.g., the third stacking via 110c) within the interposer 116R, the first stacking via 110a, the bridge die 330, the second stacking via 110b, and the second electrical connections (e.g., the fourth stacking via 110d) within the interposer 116R.

Figure 8:
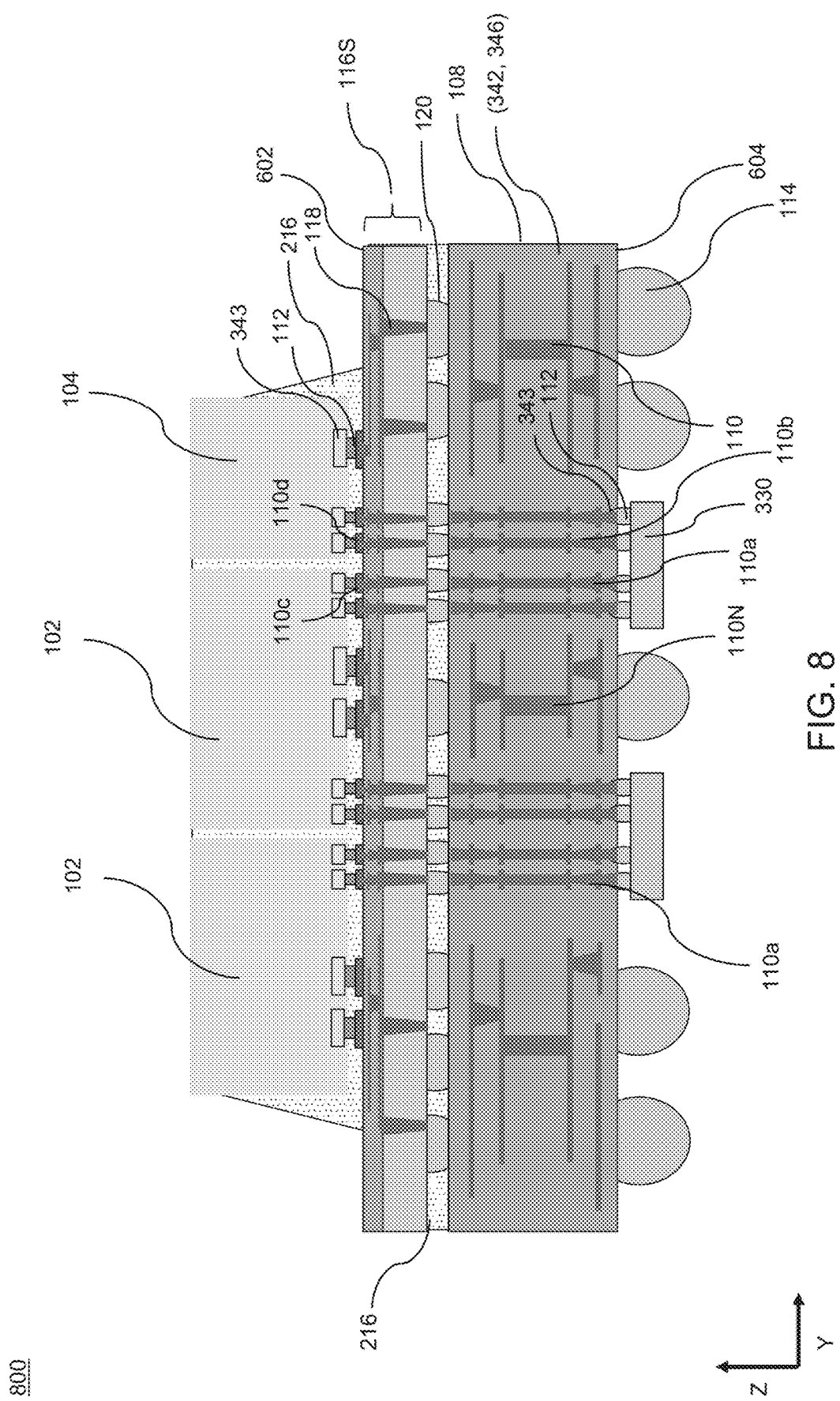
FIG. 8 is a vertical cross-sectional view of a further semiconductor device, according to various embodiments.

FIG. 8 is a vertical cross-sectional view of a further semiconductor device 800, according to various embodiments. The semiconductor device 800 may include an interposer 116S having a redistribution interconnect structure 118. In this example, the interposer 116S may be an silicon interposer (e.g, see FIG. 3 and related description above).

The semiconductor device 800 may include semiconductor dies (102, 104) that may be electrically coupled to the interposer 116S via a plurality of solder portions 112 that connect respective bonding pads or micro-bumps 343 of each of the semiconductor dies (102, 104) and the interposer 116S. The semiconductor device 800 including the semiconductor dies (102, 104) and the interposer 116S, may further be coupled to a package substrate 108 via solder portions 120 that may couple respective bonding pads or bump structure of the interposer 116S and the package substrate 108.

The package substrate 108 may further be electrically coupled to a PCB (not shown) via solder portions 114 that connect respective bump structures of the package substrate 108 and PCB. The semiconductor device 800 may be similar to various other structures described in greater detail above (e.g., see FIG. 7 and related description). For example, the interposer 116S may be an silicon interposer, as described above with reference to FIG. 3, while in further embodiments, the interposer may be an organic interposer 116R (e.g., see FIGS. 2 and 7 and related description).

As described above with reference to FIGS. 6 and 7, the package substrate 108 may include a dielectric layer (342, 346) having a first stacking via 110a formed within the package substrate 108 and a second stacking via 110b formed within the package substrate 108. The interposer 116S may similarly include a third stacking via 110c formed within the interposer 116S and a fourth stacking via 110d formed within the interposer 116S. The package substrate 108 may further include a redistribution interconnect structure 110 that includes non-stacking vias 110N in addition to the first stacking via 110a and the second stacking via 110b.

A first semiconductor die 102 may be attached to a first side 602 of the interposer 116S and may be electrically coupled to the third stacking via 110c of the interposer 116S. A second semiconductor die 104 may be attached to the first side 602 of the interposer 116S and may be electrically coupled to the fourth stacking via 110d of the interposer. As shown, the third stacking via 110c of the interposer 116S may be electrically coupled to the first stacking via 110a of the package substrate 108 and the fourth stacking via 110d of the interposer 116S may be electrically coupled to the second stacking via 110b of the package substrate 108.

The semiconductor device 600 may further include a bridge die 330 attached to an external surface of the package substrate 108. In this regard, the bridge die 330 may be attached to the second side 604 of the package substrate and may be electrically coupled to the first stacking via 110a and the second stacking via 110b. The bridge die 330 may be electrically coupled to the package substrate 108 with a first plurality of solder portions 112 that connect respective bonding pads or micro-bumps 343 of the bridge die with bonding pads or micro-bumps 343 of the package substrate 108. In various embodiments, the bridge die 330 may be configured to provide active and/or or passive interconnects between the first semiconductor die 102 and the second semiconductor die 102. Further, the placement of the bridge die 330 on the second side 604 of the package substrate 108 may provide an increased routing density of the active and/or or passive interconnects between the first semiconductor die 102 and the second semiconductor die 102.

At least one underfill material portion 216 may be formed around each bonded array of solder portions 112 on the first side 602 of the package substrate 108. Each underfill material portion 216 may be formed by injecting an underfill material around the array of solder portions 112 after the solder portions 112 are reflowed. In one embodiment, the semiconductor dies (102, 104) may be attached to the package substrate 108 and a single underfill material portion 216 may continuously extend underneath the semiconductor dies (102, 104). A similar underfill material portion 216 may be formed around each bonded array of solder portions 120 between the interposer 116S and the package substrate 108.

As shown in FIG. 8, the semiconductor device 800 includes an interposer 116S separating the first semiconductor die 102 and the second semiconductor die 104 from the package substrate 108, such that the first semiconductor die 102 and the second semiconductor die 104 are attached to the interposer 116S. The first semiconductor die 102 may be electrically connected to the first stacking via 110a of the package substrate 108 through first electrical connections (e.g., the third stacking via 110c) within the interposer 116S. The second semiconductor die 104 may be electrically connected to the second stacking via 110b of the package substrate 108 through second electrical connections (e.g., the fourth stacking via 110d) within the interposer 116S. As such, the first semiconductor die 102 and the second semiconductor die 104 may be electrically coupled to one another such that signals may be propagated from the first semiconductor die 102 to the second semiconductor die 104 and from the second semiconductor die 104 to the first semiconductor die 102 through electrical pathways formed by the first electrical connections (e.g., the third stacking via 110c) within the interposer 116S, the first stacking via 110a, the bridge die 330, the second stacking via 110b, and the second electrical connections (e.g., the fourth stacking via 110d) within the interposer 116S.

Figure 9:
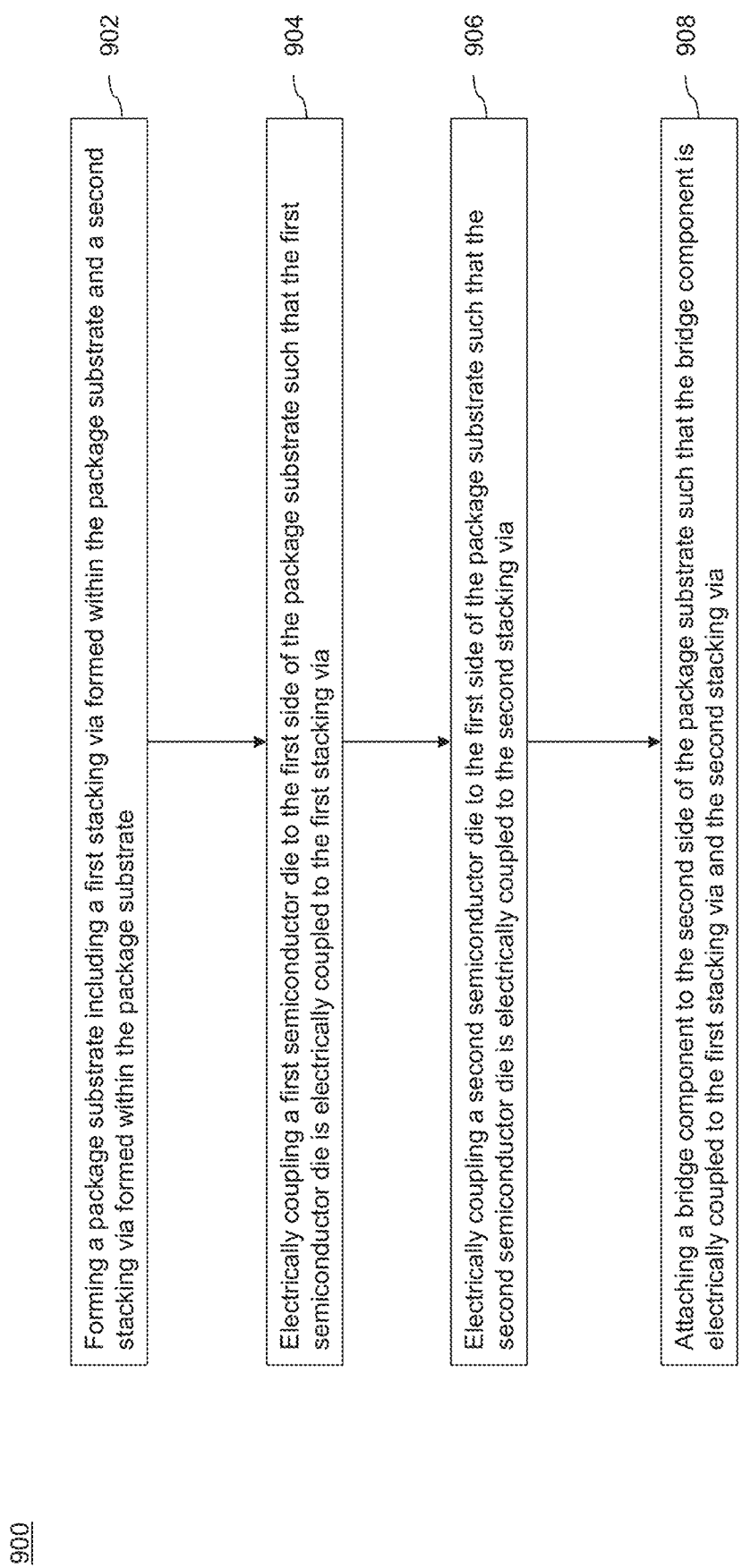
FIG. 9 is a flowchart showing operations of a method of fabricating semiconductor device structure, according to various embodiments.

FIG. 9 is a flowchart showing operations of a method 900 of fabricating a semiconductor device structure. In operation 902, the method 900 may include forming a package substrate 108 including a first side 602 and a second side 604 (e.g., see FIG. 6). Forming the package substrate 108 further includes forming a dielectric layer (342, 346) and forming a first stacking via 110a within the dielectric layer (342, 346) and forming a second stacking via 110b within the dielectric layer (342, 346). In operation 904, the method 900 may further include electrically coupling a first semiconductor die 102 to the first side 602 of the package substrate 108 such that the first semiconductor die 102 is electrically coupled to the first stacking via 110*a*. In operation 906, the method 900 may further include electrically coupling a second semiconductor die 104 to the first side 602 of the package substrate 108 such that the second semiconductor die 104 is electrically coupled to the second stacking via 110*b*.

In operation 908, the method 900 may further include attaching a bridge die 330 to the second side 604 of the package substrate 108 such that the bridge die 330 is electrically coupled to the first stacking via 110*a* and the second stacking via 110*b*. In this regard, the first semiconductor die 102 and the second semiconductor die 102 may be electrically coupled to one another such that signals may be propagated from the first semiconductor die 102 to the second semiconductor die 104 and from the second semiconductor die 104 to the first semiconductor die 102 through electrical pathways formed by the first stacking via 110*a*, the bridge die 330, and the second stacking via 110*b*.

The method 900 may further include electrically coupling an interposer (116R, 116S) to the package substrate 108 and electrically coupling the first semiconductor die 102 and the second semiconductor die 104 to the interposer (116R, 116S) such that the first semiconductor die 102 is electrically coupled to the first stacking via 110*a* of the package substrate 108 through first electrical connections (e.g., the third stacking via 110*c*) within the interposer (116R, 116S), and such that the second semiconductor die 104 is electrically coupled to the second stacking via 110*b* of the package substrate 108 through second electrical connections (e.g., the fourth stacking via 110*d*) within the interposer (116R, 116S).

In this regard the first semiconductor die 102 and the second semiconductor die 102 may be electrically coupled to one another such that signals may be propagated from the first semiconductor die 102 to the second semiconductor die 104 and from the second semiconductor die 104 to the first semiconductor die 102 through electrical pathways formed by the first electrical connections within the interposer (e.g., the third stacking via 110*c*), the first stacking via 110*a*, the bridge die 330, the second stacking via 110*b*, and the second electrical connections (e.g., the fourth stacking via 110*d*) within the interposer (116R, 116S). In various embodiments, the bridge die 330 may be configured to provide active and/or or passive interconnects between the first semiconductor die 102 and the second semiconductor die 102. Further, the placement of the bridge die 330 on the second side 604 of the package substrate 108 may provide an increased routing density of the active and/or or passive interconnects between the first semiconductor die 102 and the second semiconductor die 102.

Referring to all drawings and according to various embodiments of the present disclosure, a semiconductor device (600, 700, 800) is provided. The semiconductor device (600, 700, 800) may include a package substrate 108 having a first side 602 and a second side 604 opposite to the first side 602; a first stacking via 110*a* formed within the package substrate 108; a second stacking via 110*b* formed within the package substrate 108; and a first semiconductor die 102 attached to the first side 602 of the package substrate 108 and electrically coupled to the first stacking via 110*a*. The semiconductor device (600, 700, 800) may further include a second semiconductor die 104 attached to the first side 602 of the package substrate 108 and electrically coupled to the second stacking via 110*b*; and a bridge die 330 attached to the second side 604 of the package substrate 108 and electrically coupled to the first stacking via 110*a* and the second stacking via 110*b*. In this regard, the first semiconductor die 102 and the second semiconductor die 104 may be electrically coupled to one another through the first stacking via 110*a*, the bridge die 330, and the second stacking via 110*b*.

The first stacking via 110*a* and the second stacking via 110*b* respectively may include first electrical connections 343*a* and second electrical connections 343*b* on the first side 602 of the package substrate 108 that are respectively connected to the first semiconductor die 102 and the second semiconductor die 104, such that the first electrical connections 343*a* and the second electrical connections 343*b* each include a first pitch width W1 606 that is in a first range from approximately 10 microns to approximately 100 microns. The package substrate 108 may further include non-stacking vias 110N including third electrical connections 343*c* that are electrically connected to the first semiconductor die 102 and/or to the second semiconductor die 104, such that the third electrical connections 343*c* include a second pitch width W2 608 such that a ratio W1/W2 of the first pitch width W1 606 to the second pitch width W2 608 is in a second range from approximately 0 to approximately 1. The bridge die 330 may include electrical bump connections 343 having a third pitch width W3 610 such that a ratio W1/W3 of the first pitch width W1 606 to the third pitch width W3 610 is in a third range from approximately 0.9 to approximately 1. The bridge die 330 may further have a first height H1 612 that is in a fourth range from approximately 50 microns to approximately 200 microns.

The package substrate 108 may further include electrical connections formed as a ball grid array on the second side of the package substrate, such that the ball grid array further includes solder portions 114 having a second height H2 614, with a ratio H1/H2 of the first height H1 612 to the second height H2 614 is in a fifth range from approximately 0.1 to approximately 1. A first side 602 and the second side 604 of the package substrate 108 may each have a first area A1 620 and the bridge die 330 may have a second area A2 622, such that a ratio A2/A1 of the second area A2 622 to the first area A1 620 is in a sixth range from approximately 1% to 50%.

The semiconductor device (700, 800) may further include an interposer (116R, 116S) separating the first semiconductor die 102 and the second semiconductor die 104 from the package substrate 108 such that the first semiconductor die 102 and the second semiconductor die 104 are attached to the interposer (116R, 116S). The first semiconductor die 102 may be electrically connected to the first stacking via 110*a* of the package substrate 108 through first electrical connections (e.g., the third stacking via 110*c*) within the interposer, and the second semiconductor die 104 may be electrically connected to the second stacking via 110*b* of the package substrate 108 through second electrical connections (e.g., the fourth stacking via 110*d*) within the interposer (116R, 116S).

As such, the first semiconductor die 102 and the second semiconductor die 104 may be electrically coupled to one another such that signals may be propagated from the first semiconductor die 102 to the second semiconductor die 104 and from the second semiconductor die 104 to the first semiconductor die 102 through electrical pathways formed by the first electrical connections (e.g., the third stacking via 110*c*) within the interposer (116R, 116S) the first stacking via 110*a*, the bridge die 330, the second stacking via 110*b*, and the second electrical connections (e.g., the fourth stacking via 110*d*) within the interposer (116R, 116S). According to various embodiments, the interposer may be an organic interposer 116R (e.g., see FIGS. 2 and 7) or a silicon interposer 116S (e.g., see FIGS. 3 and 8). Further, the bridge die 330 may be configured to provide active and/or or passive interconnects between the first semiconductor die 102 and the second semiconductor die 104. Further, the placement of the bridge die 330 on the second side 604 of the package substrate 108 may provide an increased routing density of the active and/or or passive interconnects between the first semiconductor die 102 and the second semiconductor die 102.

According to further embodiments, a package substrate 108 may include a dielectric layer (342, 346) including a first side 602 and a second side 604; a first stacking via 110a including a first plurality of vertically aligned vias, formed within the dielectric layer (342, 346), which may be configured to be attached to a first semiconductor die 102 on the first side 602 of the dielectric layer (342, 346); a second stacking via 110b including a second plurality of vertically aligned vias, formed within the dielectric layer (342, 346), which may be configured to be attached to a second semiconductor die 104 on the first side 602 of the dielectric layer (342, 346); and a bridge die 330 attached to a second side 604 of the dielectric layer (342, 346) and electrically coupled to the first stacking via 110a and the second stacking via 110b.

The first stacking via 110a, the bridge die 330, and the second stacking via 110b may be configured to electrically couple the first semiconductor die 102 and the second semiconductor die 104 through the first stacking via 110a, the bridge die 330, and the second stacking via 110b.

The above-described embodiments provide advantages over conventional semiconductor device structures by providing a bridge die 330 that is attached externally to a package substrate 108. As described above, the first semiconductor die 102 and the second semiconductor die 104 may be attached and electrically coupled to a first side 602 of the package substrate 108 and the bridge die 330 may be attached and electrically coupled a second side 604 of the package substrate 108. The bridge die 330 may be electrically coupled to the first semiconductor die 102 through a first stacking via 110a formed in the package substrate 108, and to a second semiconductor die 104 through a second stacking via 110b formed in the package substrate 108.

The placement of the bridge die 330 externally to the package substrate 108 may simplify construction of the package substrate 108 and may avoid warpage and other mechanical distortions that may otherwise occur in embodiments in which the bridge die 330 is embedded in the package substrate 108. Further, the placement of the bridge die 330 on the second side 604 of the package substrate 108 may provide an increased routing density of the active and/or or passive interconnects between the first semiconductor die 102 and the second semiconductor die 102.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A semiconductor device structure, comprising:
   a package substrate comprising a first side and a second side opposite to the first side;
   a first stacking via formed within the package substrate;
   a second stacking via formed within the package substrate;
   a first semiconductor die attached to the first side of the package substrate and electrically coupled to the first stacking via;
   a second semiconductor die attached to the first side of the package substrate and electrically coupled to the second stacking via;
   an interposer separating the first semiconductor die and the second semiconductor die from the package substrate, wherein the first semiconductor die and the second semiconductor die are electrically coupled to one another such that signals are propagated from the first semiconductor die to the second semiconductor die and from the second semiconductor die to the first semiconductor die through electrical pathways formed within the interposer; and
   a bridge die attached to the second side of the package substrate and electrically coupled to the first stacking via and the second stacking via,
   wherein the first semiconductor die and the second semiconductor die are electrically coupled to one another through the first stacking via, the bridge die, and the second stacking via.

2. The semiconductor device structure of claim 1, wherein the first stacking via and the second stacking via respectively comprise first electrical connections and second electrical connections on the first side of the package substrate that are respectively connected to the first semiconductor die and the second semiconductor die, and
   wherein the first electrical connections and the second electrical connections each comprise a first pitch width W1 that is in a first range from approximately 10 microns to approximately 100 microns.

3. The semiconductor device structure of claim 2, wherein the package substrate further comprises non-stacking vias comprising third electrical connections that are electrically connected to the first semiconductor die or to the second semiconductor die, and
   wherein the third electrical connections comprise a second pitch width W2 such that a ratio W1/W2 of the first pitch width W1 to the second pitch width W2 is in a second range from approximately 0 to approximately 1.

4. The semiconductor device structure of claim 2, wherein the bridge die comprises electrical bump connections comprising a third pitch width W3 such that a ratio W1/W3 of the first pitch width W1 to the third pitch width W3 is in a third range from approximately 0.9 to approximately 1.

5. The semiconductor device structure of claim 1, wherein the bridge die comprises a first height H1 that is in a fourth range from approximately 50 microns to approximately 200 microns.

6. The semiconductor device structure of claim 5, wherein the package substrate further comprises electrical connections formed as a ball grid array on the second side of the package substrate,
   wherein the ball grid array further comprises solder portions comprising a second height H2, and
   wherein a ratio H1/H2 of the first height H1 to the second height H2 is in a fifth range from approximately 0.1 to approximately 1.

7. The semiconductor device structure of claim 1, wherein the first side and the second side of the package substrate each comprise a first area A1 and the bridge die comprises a second area A2, and
  wherein a ratio A2/A1 of the second area A2 to the first area A1 is in a sixth range from approximately 1% to 50%.

8. The semiconductor device structure of claim 1,
  wherein the first semiconductor die and the second semiconductor die are attached to the interposer,
  wherein the first semiconductor die is electrically connected to the first stacking via of the package substrate through first electrical connections within the interposer,
  wherein the second semiconductor die is electrically connected to the second stacking via of the package substrate through second electrical connections within the interposer, and
  the first stacking via, the bridge die, the second stacking via, the first electrical connections, and the second electrical connections within the interposer.

9. The semiconductor device structure of claim 1, wherein the interposer is an organic interposer or a silicon interposer.

10. The semiconductor device structure of claim 1, wherein the bridge die is configured to provide active or passive interconnects between the first semiconductor die and the second semiconductor die.

11. A package substrate, comprising:
  a dielectric layer comprising a first side and a second side;
  a first stacking via comprising a first plurality of vertically aligned vias, formed within the dielectric layer and coupled to a first semiconductor die on the first side of the dielectric layer;
  a second stacking via comprising a second plurality of vertically aligned vias, formed within the dielectric layer and coupled to a second semiconductor die on the first side of the dielectric layer; and
  a bridge die attached to a second side of the dielectric layer by electrical bump connections located on the second side of the dielectric layer and electrically coupled to the first stacking via and the second stacking via,
  wherein the first stacking via, the bridge die, and the second stacking via are configured to electrically couple the first semiconductor die and the second semiconductor die through the first stacking via, the bridge die, and the second stacking via.

12. The package substrate of claim 11, wherein the first stacking via and the second stacking via respectively comprise first electrical connections and second electrical connections on the first side of the dielectric layer that are configured to be respectively connected to the first semiconductor die and to the second semiconductor die, and
  wherein the first electrical connections and the second electrical connections each comprise a first pitch width W1 that is in a first range from approximately 10 microns to approximately 100 microns.

13. The package substrate of claim 12, further comprising non-stacking vias comprising third electrical connections that are configured to be electrically connected to the first semiconductor die or to the second semiconductor die, and
  wherein the third electrical connections comprise a second pitch width W2 such that a ratio W1/W2 of the first pitch width W1 to the second pitch width W2 is in a second range from approximately 0 to approximately 1.

14. The package substrate of claim 12, wherein the electrical bump connections comprising a third pitch width W3 such that a ratio W1/W3 of the first pitch width W1 to the third pitch width W3 is in a third range from approximately 0.9 to approximately 1.

15. The package substrate of claim 11, wherein the bridge die comprises a first height H1 that is in a fourth range from approximately 50 microns to approximately 200 microns.

16. The package substrate of claim 15, wherein the electrical connections are formed as a ball grid array,
  wherein the ball grid array further comprises solder portions comprising a second height H2, and
  wherein a ratio H1/H2 of the first height H1 to the second height H2 is in a fifth range from approximately 0.1 to approximately 1.

17. The package substrate of claim 11, wherein the first side and the second side of the dielectric layer each comprise a first area Al and the bridge die comprises a second area A2, and
  wherein a ratio A2/A1 of the second area A2 to the first area Al is in a sixth range from approximately 1% to 50%.

18. A method of fabricating a semiconductor device structure, comprising:
  forming a package substrate comprising a first side and a second side, the package substrate comprising:
    a dielectric layer;
    a first stacking via formed within the dielectric layer; and
    a second stacking via formed within the dielectric layer;
  electrically coupling a first semiconductor die to the first side of the package substrate such that the first semiconductor die is electrically coupled to the first stacking via;
  electrically coupling a second semiconductor die to the first side of the package substrate such that the second semiconductor die is electrically coupled to the second stacking via; and
  attaching a bridge die to the second side of the package substrate such that the bridge die is electrically coupled to the first stacking via and the second stacking via,
  wherein the first semiconductor die and the second semiconductor die are electrically coupled to one another through the first stacking via, the bridge die, and the second stacking via;
  electrically coupling an interposer to the package substrate and electrically coupling the first semiconductor die and the second semiconductor die to the interposer such that:
    the first semiconductor die is electrically coupled to the first stacking via of the package substrate through first electrical connections within the interposer; and
    the second semiconductor die is electrically coupled to the second stacking via of the package substrate through second electrical connections within the interposer.

19. The method of claim 18,
  wherein the first semiconductor die and the second semiconductor die are electrically coupled to one another through the first electrical connections within the interposer, the first stacking via, the bridge die, the second stacking via, and the second electrical connections within the interposer.

20. The method of claim 18, further comprising:
 configuring the bridge die to provide active or passive interconnects between the first semiconductor die and the second semiconductor die.

\* \* \* \* \*